(12) United States Patent
Chu et al.

(10) Patent No.: US 11,946,945 B2
(45) Date of Patent: Apr. 2, 2024

(54) SAMPLE ANALYZING METHOD AND SAMPLE PREPARING METHOD

(71) Applicant: Materials Analysis Technology Inc., Hsinchu County (TW)

(72) Inventors: Keng-Chieh Chu, New Taipei (TW); Tsung-Ju Chan, Miaoli County (TW); Chun-Wei Wu, New Taipei (TW); Hung-Jen Chen, Hsinchu (TW)

(73) Assignee: MATERIALS ANALYSIS TECHNOLOGY INC., Hsinchu County (TW)

( * ) Notice: Subject to any disclaimer, the term of this patent is extended or adjusted under 35 U.S.C. 154(b) by 371 days.

(21) Appl. No.: 17/388,125

(22) Filed: Jul. 29, 2021

(65) Prior Publication Data
US 2022/0334140 A1 Oct. 20, 2022

(30) Foreign Application Priority Data

Apr. 15, 2021 (TW) .................................. 110113511

(51) Int. Cl.
*H01J 37/20* (2006.01)
*G01N 35/00* (2006.01)
(Continued)

(52) U.S. Cl.
CPC ..... *G01N 35/00732* (2013.01); *G06K 7/1413* (2013.01); *H01J 37/26* (2013.01);
(Continued)

(58) Field of Classification Search
None
See application file for complete search history.

(56) References Cited

U.S. PATENT DOCUMENTS

| 6,715,870 B2 | 4/2004 | Kiene et al. |
| 7,005,636 B2 | 2/2006 | Tappel |

(Continued)

FOREIGN PATENT DOCUMENTS

| CN | 111707649 A | 9/2020 |
| JP | 11258130 A | 9/1999 |

(Continued)

*Primary Examiner* — Eliza W Osenbaugh-Stewart
(74) *Attorney, Agent, or Firm* — Li & Cai Intellectual Property (USA) Office

(57) ABSTRACT

A sample analyzing method and a sample preparing method are provided. The sample analyzing method includes a sample preparing step, a placing step, and an analyzing step. The sample preparing step includes an obtaining step implemented by obtaining an identification information; and a marking and placing step implemented by placing a sample carrying component having a sample disposed thereon into a marking equipment, allowing the marking equipment to utilize the identification information to form an identification structure on the sample carrying component, and placing the sample carrying component into one of the accommodating slots according to the identification information. The placing step is implemented by taking out the sample carrying component from one of the accommodating slots and placing the sample carrying component into an electron microscope equipment. The analyzing step is implemented by utilizing the electron microscope equipment to photograph the sample to generate an analyzation image.

10 Claims, 14 Drawing Sheets

(51) Int. Cl.
*G06K 7/14* (2006.01)
*H01J 37/26* (2006.01)

(52) U.S. Cl.
CPC ............... *G01N 2035/00752* (2013.01); *H01J 2237/20292* (2013.01)

(56) References Cited

U.S. PATENT DOCUMENTS

| | | |
|---|---|---|
| 7,966,091 B2 | 6/2011 | Fujimoto et al. |
| 8,906,303 B2 | 12/2014 | Ermantraut et al. |
| 10,591,393 B2 | 3/2020 | Krause et al. |
| 10,636,619 B2 | 4/2020 | Suzuki |
| 11,101,104 B2 | 8/2021 | Kuijper et al. |
| 11,192,083 B2 | 12/2021 | Kraft et al. |
| 2015/0170874 A1* | 6/2015 | Price ............... H01J 37/023 250/440.11 |
| 2017/0207062 A1 | 7/2017 | Dufresne et al. |

FOREIGN PATENT DOCUMENTS

| | | |
|---|---|---|
| JP | 2001147208 A | 5/2001 |
| JP | 2002365184 A | 12/2002 |
| JP | 20053682 A | 1/2005 |
| JP | 200936552 A | 2/2009 |
| JP | 20173579 A | 1/2017 |
| JP | 2019145304 A | 8/2019 |
| JP | 4548356 B2 | 9/2020 |
| JP | 202139943 A | 3/2021 |
| TW | 201333188 A1 | 8/2013 |
| TW | 202045709 A | 12/2020 |
| WO | 2013052318 A1 | 4/2013 |

\* cited by examiner

```
┌─────────────────────────────────────────────┐
│ The assembled marking and placing step is implemented   │
│ by utilizing the marking equipment to form a plurality of│ ~S011
│ assembled mark structures having different styles on a  │
│ large size substrate                                    │
└─────────────────────────────────────────────┘
                    ↓
┌─────────────────────────────────────────────┐
│ The large size cutting step is implemented by utilizing a│
│ cutting equipment to perform a cutting operation on the │ ~S012  S01
│ large size substrate at least once, so that the large size│
│ substrate is cut into a plurality of small size substrates│
└─────────────────────────────────────────────┘
                    ↓
┌─────────────────────────────────────────────┐
│ The sampling step is implemented by utilizing a sampling│
│ equipment to cut one of the small size substrates to obtain│ ~S013
│ the sample                                              │
└─────────────────────────────────────────────┘
                    ↓
┌─────────────────────────────────────────────┐
│ The preparation step is implemented by placing the       │
│ sample onto the mesh structure of the sample carrying    │
│ component and placing the sample carrying component      │
│ having the sample disposed thereon into one of the       │
│ accommodating slots of the storage box, and utilizing an │ ~S02
│ input device to input a content shown by a mark          │
│ structure of the storage box near the one of the         │
│ accommodating slots to the input device to form the      │
│ identification information                               │
└─────────────────────────────────────────────┘
                    ↓
```

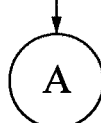

FIG. 11A

The obtaining step is implemented by obtaining an identification information. The identification information is configured to indicate a position of one of the accommodating slots of a storage box, and the storage box includes the accommodating slots ~S21

The marking and placing step is implemented by placing a sample carrying component having at least one sample disposed thereon into a marking equipment, allowing the marking equipment to utilize the identification information to form an identification structure on the sample carrying component, and placing the sample carrying component into a corresponding one of the accommodating slots according to the identification information ~S22

FIG. 13

SAMPLE ANALYZING METHOD AND SAMPLE PREPARING METHOD

CROSS-REFERENCE TO RELATED PATENT APPLICATION

This application claims the benefit of priority to Taiwan Patent Application No. 110113511, filed on Apr. 15, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sample analyzing method and a sample preparing method, and more particularly to a sample analyzing method and a sample preparing method suitable for utilizing an electron microscope equipment to analyze a sample.

BACKGROUND OF THE DISCLOSURE

A conventional process for utilizing an electron microscope equipment to observe a sample is substantially as follows. A technical personnel first takes out a component carrying a sample from a temporary storage device, and then uses paper and pen to record a position of the temporary storage device where the component is taken out from.

After technical personnel finishes observing the sample by utilizing the electron microscope equipment, the technical personnel returns the component back to the original temporary storage device. At this time, if technical personnel cannot find the paper used to record the position of the temporary storage device where the component is originally taken out from, the component may be returned to a position different from the position where the component is originally taken out from by the technical personnel, which may lead to errors in related follow-up processes.

SUMMARY OF THE DISCLOSURE

In response to the above-referenced technical inadequacy, the present disclosure provides a sample analyzing method and a sample preparing method to improve on an issue associated with a conventional sample analyzing method or a conventional sample preparing method (i.e., after a user finishes observing a sample, the sample is easily returned to a wrong position of a storage box by the user).

In one aspect, the present disclosure provides a sample analyzing method. The sample analyzing method includes a sample preparing step, a placing step, and an analyzing step. The sample preparing step is implemented at least once, and the sample preparing step includes an obtaining step and a marking and placing step. The obtaining step is implemented by obtaining an identification information. The identification information is configured to indicate a position of one of a plurality of accommodating slots of a storage box, and the storage box includes the accommodating slots. The marking and placing step is implemented by placing a sample carrying component having at least one sample disposed thereon into a marking equipment, allowing the marking equipment to utilize the identification information to form an identification structure on the sample carrying component, and placing the sample carrying component into a corresponding one of the accommodating slots according to the identification information. The sample carrying component includes a main body and at least one mesh structure, the main body has at least one thru-hole penetrating through the main body, the at least one mesh structure is connected to the main body, the at least one mesh structure is arranged in the at least one thru-hole, the at least one mesh structure divides the at least one thru-hole into a plurality of meshes, and the at least one mesh structure is configured to carry the at least one sample. The placing step is implemented by taking out the sample carrying component having the identification structure from one of the accommodating slots of the storage box, and placing the sample carrying component into an electron microscope equipment. The analyzing step is implemented by utilizing the electron microscope equipment to photograph the at least one sample to generate an analysis image.

In another aspect, the present disclosure provides a sample preparing method including an obtaining step and a marking and placing step. The obtaining step is implemented by obtaining an identification information. The identification information is configured to indicate a position of one of a plurality of accommodating slots of a storage box, and the storage box includes the accommodating slots. The marking and placing step is implemented by placing a sample carrying component having at least one sample disposed thereon into a marking equipment, allowing the marking equipment to utilize the identification information to form an identification structure on the sample carrying component, and placing the sample carrying component into a corresponding one of the accommodating slots according to the identification information. The sample carrying component includes a main body and at least one mesh structure, the main body has at least one thru-hole penetrating through the main body, the at least one mesh structure is connected to the main body, the at least one mesh structure is arranged in the at least one thru-hole, the at least one mesh structure divides the at least one thru-hole into a plurality of meshes, and the at least one mesh structure is configured to carry the at least one sample.

Therefore, through the sample analyzing method and the sample preparing method of the present disclosure, after technical personnel finishes observing the sample through the electron microscope equipment, a probability of the sample carrying component and the sample carried thereby being placed in a wrong position of the storage box by technical personnel can be effectively decreased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 11A and FIG. 11B are a flowchart of a sample analyzing method according to one embodiment of the present disclosure;

FIG. 13 is a flowchart a sample preparing method according to the present disclosure.

DETAILED DESCRIPTION OF THE EXEMPLARY EMBODIMENTS

Figure 1:
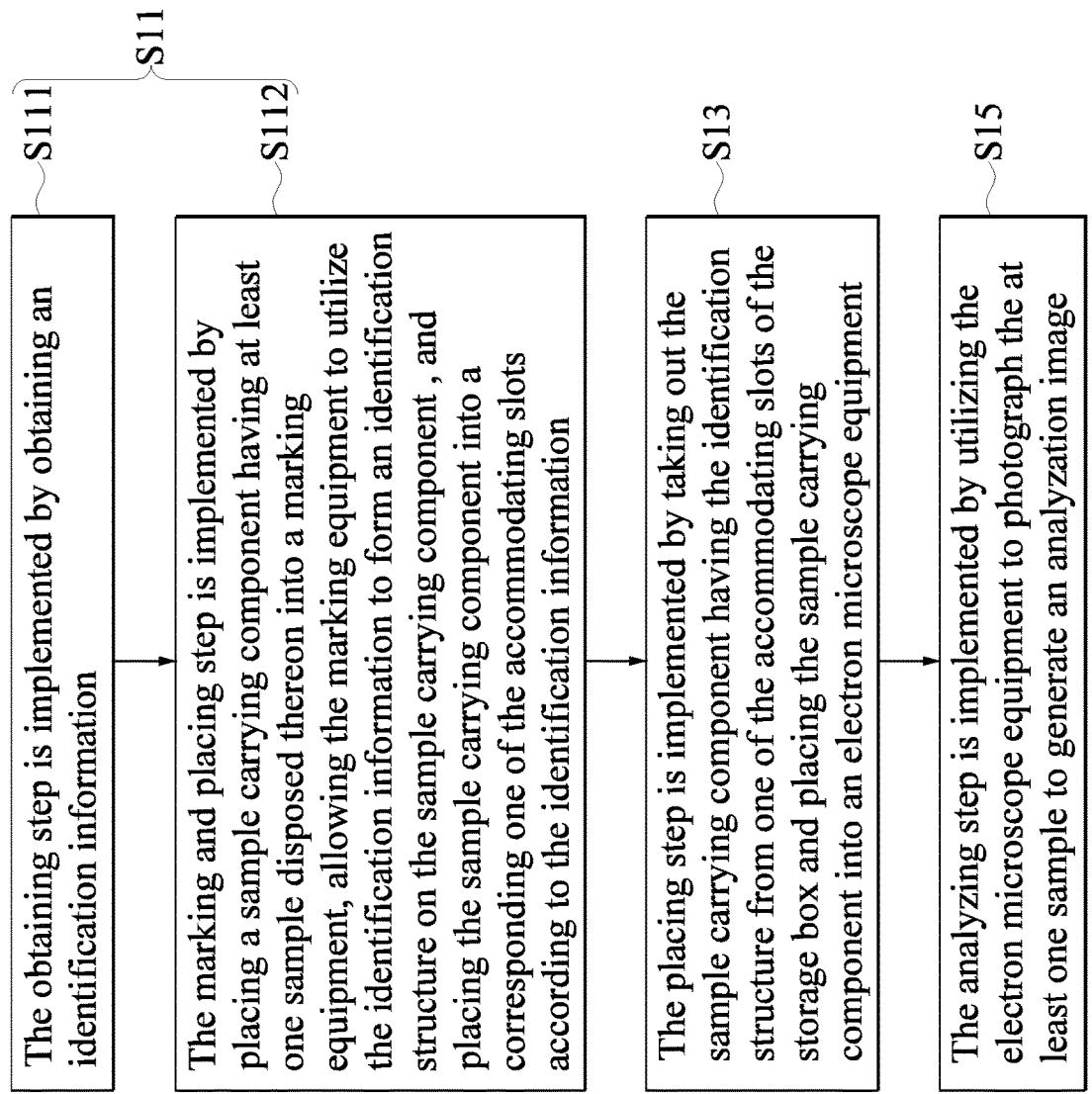
FIG. 1 is a flowchart of a sample analyzing method according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 4, a sample analyzing method of the present disclosure includes a sample preparing step S11, a placing step S13, and an analyzing step S15. The sample preparing step S11 is implemented at least once, and the sample preparing step S11 includes an obtaining step S111 and a marking and placing step S112.

The obtaining step S111 is implemented by obtaining an identification information. The identification information is configured to indicate a position of one of a plurality of accommodating slots 211 of a storage box 2.

The marking and placing step S112 is implemented by placing a sample carrying component 1 having at least one sample S disposed thereon into a marking equipment, allowing the marking equipment to utilize the identification information to form an identification structure 13 on the sample carrying component 1, and placing the sample carrying component 1 into a corresponding one of the accommodating slots 211 according to the identification information.

The placing step S13 is implemented by taking out the sample carrying component 1 having the identification structure 13 from one of the accommodating slots 211 of the storage box 2 and placing the sample carrying component 1 into an electron microscope equipment.

The analyzing step S15 is implemented by utilizing the electron microscope equipment to photograph the at least one sample S to generate an analysis image.

The number of times the sample preparing step S11 is implemented can be decided according to practical requirements and the quantity of the accommodating slots 211 included by the storage box 2, and the present disclosure is not limited thereto. Specifically, technical personnel can repeatedly implement the sample preparing step S11 for many times, so that a plurality of the sample carrying components 1 having the identification structures 13 are stored in the storage box 2, and then the placing step S13 and the analyzing step S15 are implemented.

In other embodiments, in addition to a related content showing the position of one of the accommodating slots 211 of the storage box 2, the identification information 13 obtained in the obtaining step S111 can further include other related content about the storage box 2, a related content of the sample carrying component 1 disposed in the storage box 2, and a related content of the sample S disposed on the sample carrying component 1 according to practical requirements. For example, the identification information 13 can further include a material of the sample S, an observation magnification of the sample S, and a quantity of a plurality of sampling observation areas.

Figure 2:
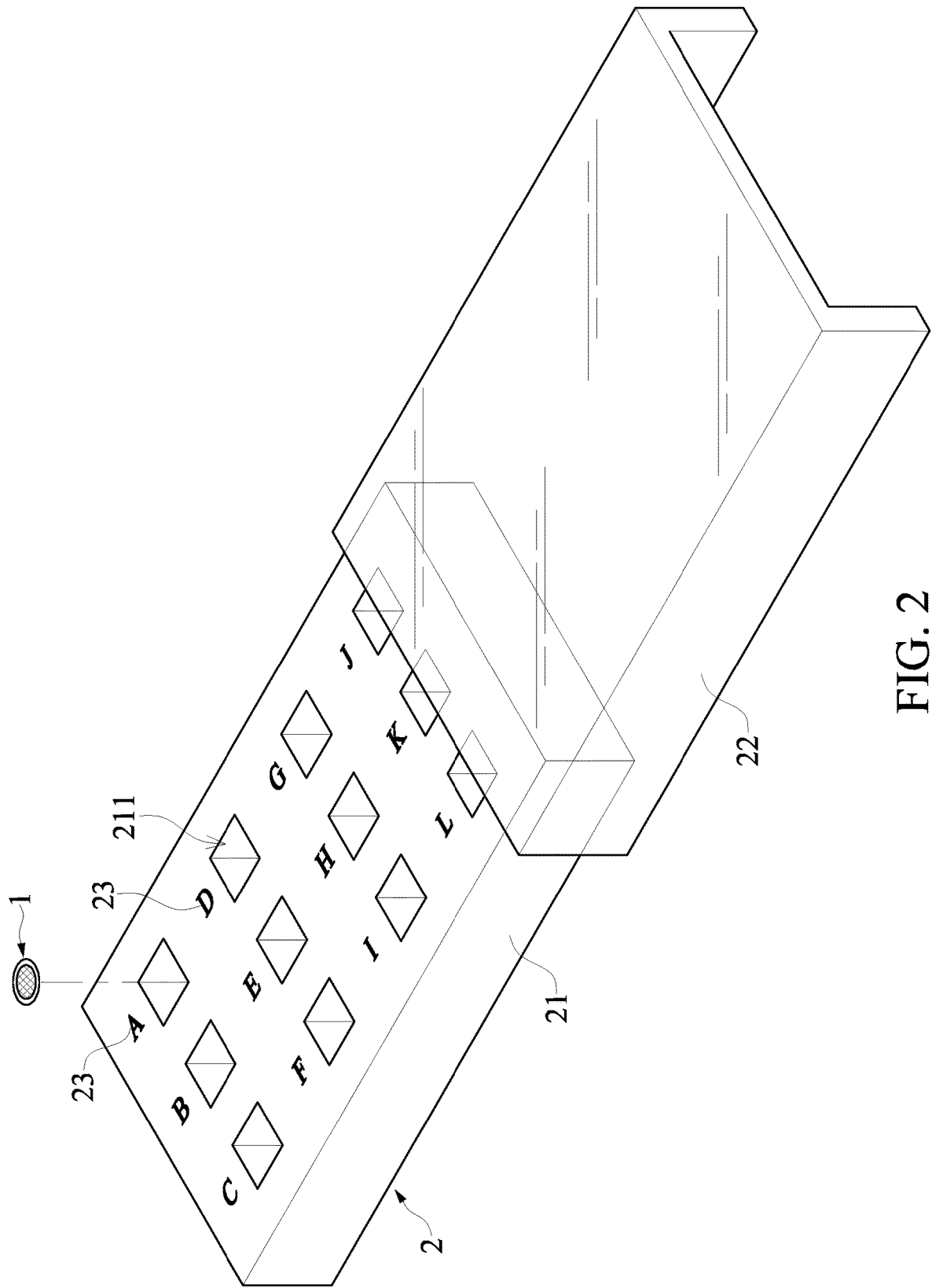
FIG. 2 is a schematic view of a storage box and a sample carrying component of the sample analyzing method according to one embodiment of the present disclosure.
Figure 3:
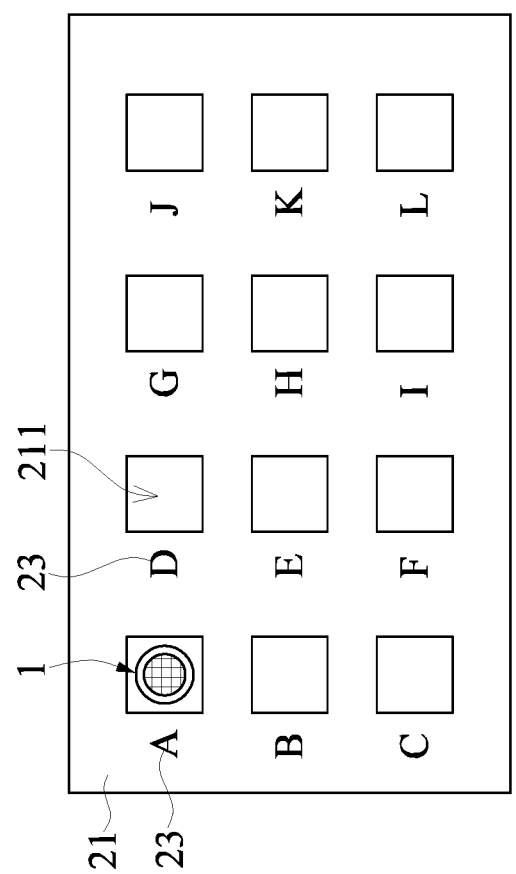
FIG. 3 is a top view of the storage box having the sample carrying component disposed therein of the sample analyzing method according to one embodiment of the present disclosure.
Figure 4:
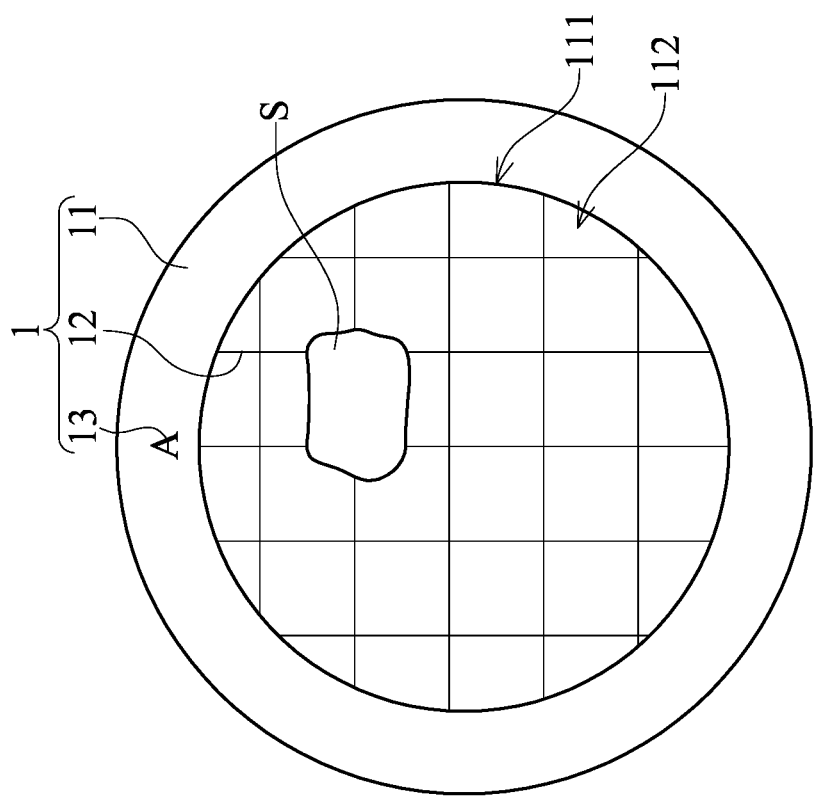
FIG. 4 is a top view of the sample carrying component carrying the sample of the sample analyzing method according to one embodiment of the present disclosure.

Referring to FIG. 2 to FIG. 4, in a practical application, the storage box 2 can include a box body 21, a lid 22, and twelve mark structures 23. The box body 21 includes twelve accommodating slots 211. Each of the accommodating slots 211 is configured to accommodate one of the sample carrying components 1. The quantity of the accommodating slots 211 included in the box body 21 can be increased or decreased according to practical requirements, and the quantity of the accommodating slots 211 is not limited to that shown in FIG. 2 to FIG. 4. The lid 22 is detachably connected to the box body 21, a user can operate the lid 22 so that the lid 22 covers all of the accommodating slots 211, and the sample carrying components 1 disposed in the accommodating slots 211 can be prevented from leaving the accommodating slots 211. The dimensions and the structures of the box body 21 and the lid 22, and the manner in which the lid 22 and the box body 21 are connected to each other are not limited to those shown in FIG. 2 to FIG. 4. In other embodiments, the storage box 2 can be provided to not include the lid 22.

The twelve mark structures 23 having different styles are disposed at one side of the storage box 2, each of the mark structures 23 is disposed near one of the accommodating slots 211, and each of the mark structures 23 is provided so that the user can identify the different one of the accommodating slots 211. Each of the mark structures 23 can be, for example, presented in at least one of a textual manner (e.g., English texts, Chinese texts, or texts of any country), a numerical manner (e.g., Arabic numerals or Roman numerals), a symbolic manner (e.g., various types of geometric figures), and a patterned manner (e.g., any pattern determined by the user). For example, the twelve mark structures 23 can be respectively presented on the box body 21 in English texts of A, B, C, D, E, F, G, H, I, J, K, and L. In another embodiment, each of the mark structures 23 can include a text and a number at the same time. For example, the twelve mark structures 23 can respectively be A1, A2, A3, B1, B2, B3, C1, C2, C3, D1, D2, and D3. The quantity of the mark structures 23 corresponds to the quantity of the accommodating slots 211, and the each of the mark structures 23 is provided so that the user can identify the corresponding one of the accommodating slots 211.

Referring to FIG. 4, each of the sample carrying components 1 is configured to carry one of the samples S. Each of the sample carrying components 1 carrying the samples S is configured to be disposed in an electron microscope equipment (e.g., various types of transmission electron microscope, scanning electron microscope, and atomic force microscope), and technical personnel can observe the samples S on the sample carrying components 1 through the electron microscope equipment. Each of the sample carry components 1 includes a main body 11, a mesh structure 12, and an identification structure 13.

The main body 11 has a thru-hole 111 penetrating through the main body 11. The structures and dimensions of the main body 11 and the thru-hole 111 are not limited to those shown in the figures of the present disclosure. The material of the main body 11 and the material of the mesh structure 12 can include copper or nickel, and can be selected according to the type of the sample, but the present disclosure is not limited thereto. The mesh structure 12 is connected to the main body 11, the mesh structure 12 is arranged in the thru-hole 111, the mesh structure 12 divides the thru-hole 111 into a plurality of meshes 112, and the mesh structure 12 is configured to carry the sample S. The structure and the dimension of the meshes 112 can be decided according to the dimension and the structure of the sample S, but the present disclosure is not limited thereto. In a practical application, the material of the mesh structure 12 can be the same as the material of the main body 11.

Each of the identification structures 13 can be presented in at least one of a textual manner, a numerical manner, a symbolic manner, and a patterned manner. In a practical application, each of the identification structures 13 can be recessed in one side of the main body 11, or each of the identification structures 13 can be a thru-hole structure penetrating through the main body 11. For example, the marking equipment can be utilized to form each of the identification structures 13 onto the main body 11 through a laser technique, laser etching, physical processing, or ink printing.

Each of the identification structures 13 can be presented in a manner the same as the manner in which one of the mark structures 23 of the storage box 2 is presented. Referring to the figures of the present embodiment, the sample carrying component 1 shown in FIG. 4 is disposed in one of the accommodating slots 211 in FIG. 3 at the upper left corner of the storage box 2, the mark structure 23 near the one of the accommodating slots 211 is presented as "A". In the marking and placing step S112, the marking equipment forms the identification structure 13 that is presented as "A" on the main body 11, and then the sample carrying component 1 is stored in the one of the accommodating slots 211 at the upper left corner of the storage box 2.

In a practical application, the identification information includes all information that is required when the marking equipment forms the identification 13 on the sample carry component 1. For example, as shown in FIG. 1, FIG. 3, and FIG. 4, in the placing step S13, if the sample carrying component 1 in the one of the accommodating slots 211 arranged near "A" is taken out from the storage box 2 shown in FIG. 3, in the obtaining step S111, the identification information can at least include a "A" string or any corresponding data therein that is enough for the marking equipment to read, so that in the marking and placing step S112, the marking equipment can correctly form the identification structure 13 presented as "A" on the sample carrying component 1.

Figure 5:
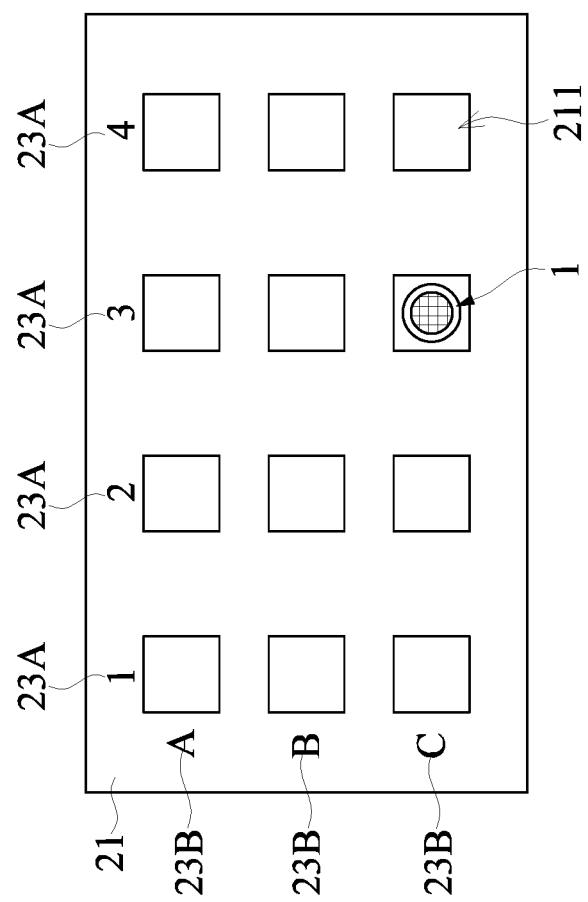
FIG. 5 is a top view of the storage box of the sample analyzing method according one embodiment of the present disclosure.
Figure 6:
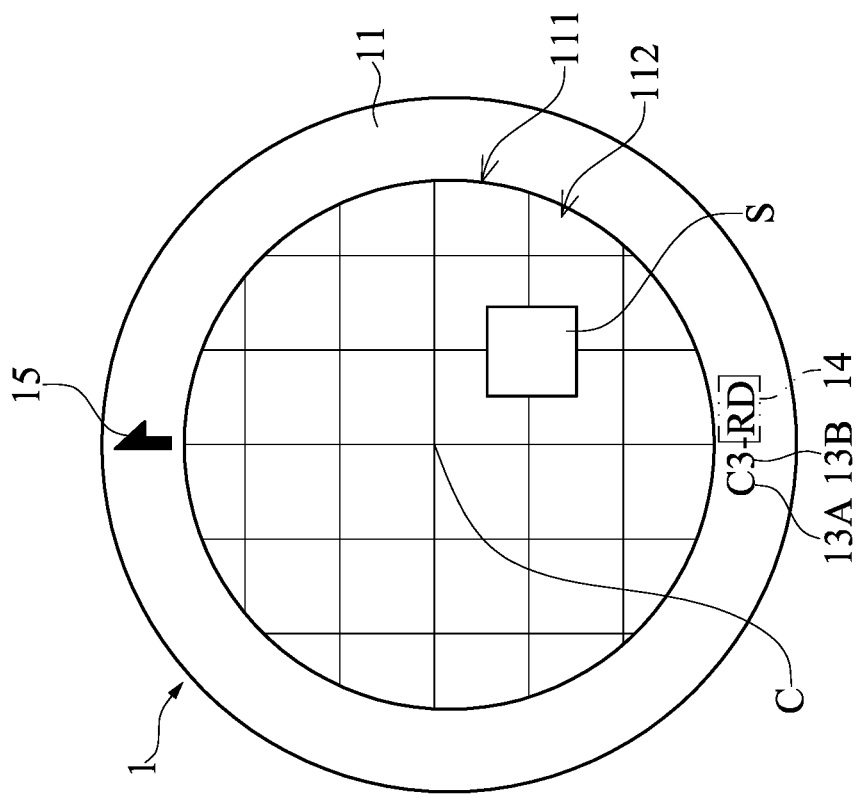
FIG. 6 is a top view of the sample carrying component carrying the sample of the sample analyzing method according to one embodiment of the present disclosure.

According to the above, through the design of the marking and placing step S112, in the analyzing step S15, when the user uses the electron microscope equipment to observe the sample S, the user can look at the identification structure 13 to know which one of the accommodating slots 211 of the storage box 2 where the sample S that is currently observed is originally disposed. In this way, after the user finishes observing the sample S and returns the sample carrying component 1 to the storage box 2, a mistake does not easily occur. Referring to FIG. 5 and FIG. 6, in other embodiments, the quantity of the mark structures included by the storage box 2 can be less than the quantity of the accommodating slots 211, and the mark structures can be defined into three longitudinal mark structures 23A having different styles and four horizontal mark structures 23B having different styles according to the positions thereof. For example, if the accommodating slots 211 included by the storage box 2 are arranged in a 3*4 matrix, the storage box 2 can include four longitudinal mark structures 23A having different styles and three horizontal mark structures 23B having different styles. Each of the longitudinal mark structures 23A can be presented in at least one of a textual manner, a numerical manner, a symbolic manner, and a patterned manner, and each of the horizontal mark structures 23B can be presented in at least one of a textual manner, a numerical manner, a symbolic manner, and a patterned manner. For example, the four longitudinal mark structures 23A can be presented as Arabic numerals of 1, 2, 3, and 4, and the three horizontal mark structures 23B can be presented as English texts of A, B, and C, but the present disclosure is not limited thereto.

Relatively, in the marking and placing step S112, the marking equipment forms an identification structure 13A and an identification structure 13B on the sample carrying component 1. The identification structure 13A is configured to show a horizontal position of the sample carrying component 1 stored in the storage box 2, the identification structure 13B is configured to show a longitudinal position of the sample carrying component 1 stored in the storage box 2, the type of the identification structure 13A is the same as the type of one of the longitudinal mark structures 23A, and the type of the identification structure 13B is that same as the type of one of the horizontal mark structures 23B. Specifically, the identification structure 13A can be presented as an English text "C", and the identification structure 13B can be presented as an Arabic numeral "3".

According to the above, in the analyzing step S15, the user can see "C3" presented by the identification structure 13A and the identification structure 13B on the sample carrying component 1 through the electron microscope equipment to know that the sample carrying component 1 shown in FIG. 6 is disposed at a position of a third row (the row marked with the English text "C") and a third column (the column marked with the Arabic numeral "3") of the storage box 2 shown in FIG. 5.

It should be noted that the positions where the identification structure 13A and the identification structure 13B are disposed on the main body 11 can be changed according to practical requirements, and are not limited to those shown in the figures of the present disclosure. In addition, a distance between the identification structure 13A and the identification structure 13B can be designed according to practical requirements. In a special application, the identification structure 13A and the identification structure 13B can be disposed away from each other (e.g., the identification structure 13A is disposed at a left side of the main body 11, and the identification structure 13B is disposed at a right side of the main body 11).

Referring to FIG. 6 to FIG. 9, in other embodiments, in the marking and placing step S112, the marking equipment is further utilized to form at least one position identification structure 14 (e.g., a position identification structure 14A and a position identification structure 14B), a direction identification structure 15, and at least one of a sample identification structure 16A and a sample identification structure 16B. Referring to FIG. 6, the at least one position identification structure 14 is configured to show a position of the sample S carried by the sample carrying component 1 relative to a center C (i.e., a central position) of the sample carrying component 1. The position identification structure 14 can be presented in at least one of a textual manner, a numerical manner, a symbolic manner, and a patterned manner.

In a practical application, when the marking equipment is utilized to form the position identification structure 14 on the main body 11, the type of the position identification structure 14 can be decided according to the position of the sample S carried by the sample carrying component 1 relative to the center C of the mesh structure 12. As shown in FIG. 6, for example, technical personnel can allow the position identification structure 14 to presented as RU, RD, LU, or LD, so as to respectively show that the sample S is at a right upper position, a right bottom position, a left upper position, or a left bottom position relative to the center C. In other words, after the user places the sample S at the right bottom position relative to the center C of the mesh structure 12, the marking equipment (e.g., a laser engraving machine) can be utilized to form the position identification structure 14 presented as "RD".

In a practical application, the identification structure 13 and the position identification structure 14 can be disposed at two uniform positions of the main body 11, in the analyzing step S15, the user can relatively move a carrying platform of the sample carrying component 1 and a camera shot of the electron microscope equipment, so that the position identification structure 14 is arranged in a vision scope of the electron microscope equipment, and then the user or a related image capture equipment can decide a relative movement direction of the carrying platform and the camera shot by viewing the position identification structure 14. In this way, technical personnel can relatively quickly find the sample S carried by the sample carrying component 1 and observe the sample S.

Referring to FIG. 6, the direction identification structure 15 can be presented in at least one of a textual manner, a numerical manner, a symbolic manner, and a patterned manner. Before technical personnel or a related equipment views the position identification structure 14, technical personnel or the related equipment can view the direction identification structure 15 in advance. In this way, it can be ensured that the vision scope of the electron microscope equipment is moved to a correct position after technical personnel or the related equipment views the position identification structure 14.

Specifically, when the marking equipment forms the position identification structure 14 on the main body 11, if the direction identification structure 15 is arranged above the center C of the mesh structure 12 and the sample S is arranged at a bottom right position relative to the center C of the mesh structure 12, the marking equipment forms the position identification structure 14 that is presented as "RD". Afterwards, in the analyzing step S15, the user can see whether or not the direction identification structure 15 is arranged above the center C of the mesh structure 12 to decide a follow-up movement direction of the vision scope. In other words, if the user sees that the direction identification structure 15 is arranged above the center C of the mesh structure 12 in the vision scope, the user can then control the vision scope to move to the bottom right relative to the center C of the mesh structure 12. Otherwise, the user controls the vision scope to move to the upper left.

Figure 7:
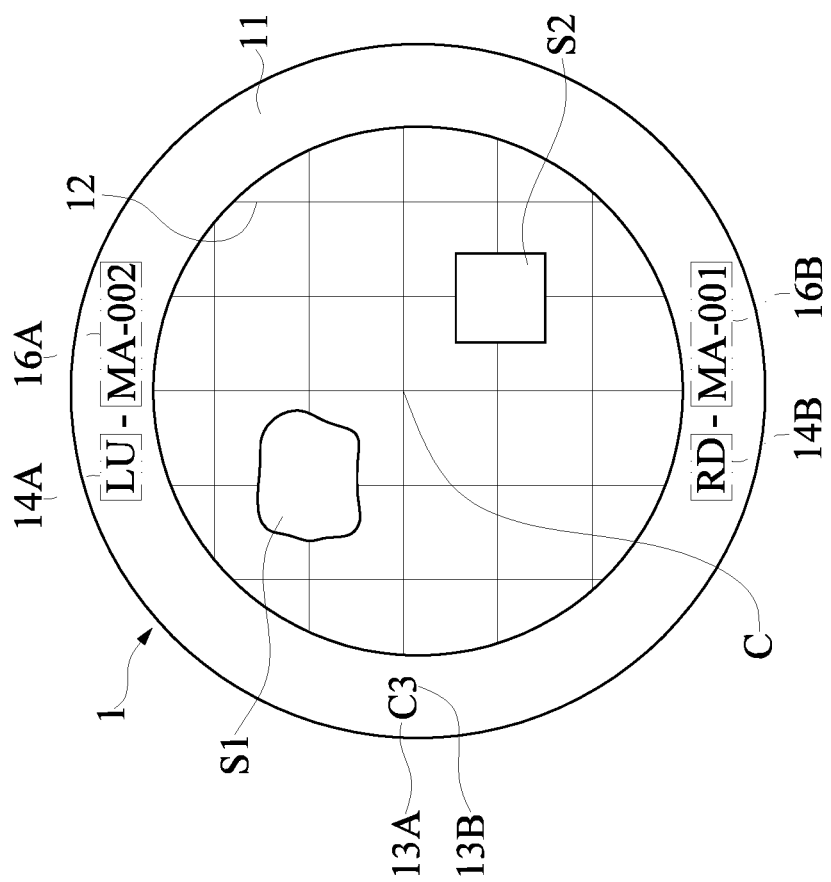
FIG. 7 is a top view of the sample carrying component carrying the sample of the sample analyzing method according to one embodiment of the present disclosure.

Referring to FIG. 7, in other embodiments, if the sample carrying component 1 carries a sample S1 and a sample S2 at the same time, in the marking and placing step S112, the marking equipment forms the position identification structure 14A, the position identification structure 14B, the sample identification structure 16A, and the sample identification structure 16B on the sample carrying component 1. The quantity of the position identification structures and the quantity of the sample identification structures can be decided according to the quantity of the samples carried by the mesh structure. The position identification structure 14A is configured to show the position of the sample S1 on the mesh structure 12 relative to the center C of the mesh structure 12. The position identification structure 14B is configured to show the position of the sample S2 on the mesh structure 12 relative to the center C of the mesh structure 12.

The sample identification structure 16A is disposed near the position identification structure 14A, the sample identification structure 16B is disposed near the position identification structure 14B, and the sample identification structure 16A and the sample identification structure 16B are configured to allow the user to identify related data of the sample S1 and the sample S2 on the mesh structure 12. For example, MA-001 and MA-002 are presented in FIG. 7, MA can be a company label, and 001 and 002 can be sample numerals of the company.

According to the above, specifically, in the analyzing step S15, technical personnel can see the position identification structure 14A and the sample identification structure 16A presented as "RD-MA-001" through the electron microscope equipment, and technical personnel can know the sample S2 having the company label of MA and the sample numeral of 001 is disposed at a bottom right position of the mesh structure 12. Technical personnel can see the position identification structure 14B and the sample identification structure 16B presented as "LU-MA-002" through the electron microscope equipment, and technical personnel can know the sample S1 having the company label of MA and the sample numeral of 002 is disposed at an upper left position of the mesh structure 12.

Referring to FIG. 6 and FIG. 7, it is worth mentioning that in an embodiment of the present disclosure, after the marking and placing step S112, the position identification structure 14A, the position identification structure 14B, the sample identification structure 16A, and the sample identification structure 16B are formed on the sample carrying component 1, the identification information obtained in the obtaining step S111 can include data such as "RD", "RD-MA-0011", and "LU-MA-002", or a related data that is enough for the marking equipment to read, so that the marking equipment can correctly form the position identification structure 14A, the position identification structure 14B, the sample identification structure 16A, and the sample identification structure 16B presented as "RD", "RD-MA-0011", and "LU-MA-002".

Figure 8:
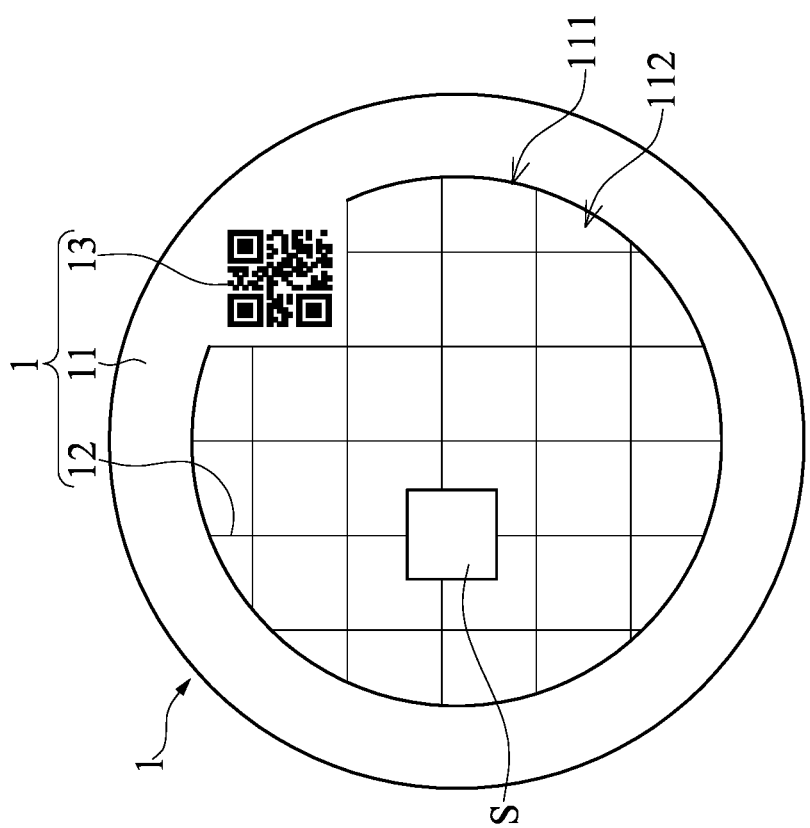
FIG. 8 is a top view of the sample carrying component carrying the sample of the sample analyzing method according to one embodiment of the present disclosure.

Referring to FIG. 8, in other embodiments, in the marking and placing step S112, the identification structure 13 can be presented in a patterned manner on the main body 11 by the marking equipment. Particularly, the identification structure 13 can be presented in the patterned manner of a two-dimensional barcode on the main body 11 by the marking equipment. Naturally, the identification structure 13 can be presented in the patterned manner of a one-dimensional barcode on the main body 11 by the marking equipment. In a practical application, the one-dimensional barcode or the two-dimensional barcode can store any related data about the sample S and the sample carrying component 1. For example, the barcode can store the company data (e.g., a company code) of the sample, the sample numeral, the position of the sample relative to the mesh structure 12, the type of the sample, and the position where the sample carrying component 1 is disposed in the storage box 2. In the embodiment shown in FIG. 8, the identification information obtained in the obtaining step S111 includes enough related data for the marking equipment to read, and the marking equipment can form the one-dimensional barcode or the two-dimensional barcode on the sample carrying component 1.

According to the above, through the design of the identification structure, the position identification structure, the direction identification structure, and the sample identification structure formed on the sample carrying component 1 in the marking and placing step S12, when the samples are disposed on the mesh structure 12, the user cannot easily make a wrong observation or a recording mistake.

Therefore, in the sample analyzing method of the present disclosure, through the obtaining step S111 and the marking and placing step S112, an issue associated with technical personnel's recording mistake and taking or placing the wrong sample carrying equipment can be effectively prevented, and a mistake probability of the overall analyzing process can be reduced.

In a practical application, in the analyzing step S15, technical personnel can see the identification structure 13 on the sample carrying component 1 through the electron microscope equipment to determine whether the sample on the sample carrying component 1 currently in the electron microscope equipment is the same as the sample that is currently predetermined to be analyzed. For example, as shown in FIG. 6, if technical personnel see the identification structure 13 on the sample carrying component 1 is presented as "C3" through the electron microscope equipment, technical personnel can see the identification information through a related display to confirm whether or not the identification information shows "C3". If technical personnel does not see "C3" from the related display, the sample S carried by the sample carrying component 1 currently in the electron microscope equipment is not the sample that is currently predetermined to be analyzed. In contrast, if the sample currently in the electron microscope equipment is the sample currently predetermined to be analyzed, the analysis image generated later in the analyzing step S15 can be correctly recorded into a related equipment (e.g., a computer or a server).

Figure 9:
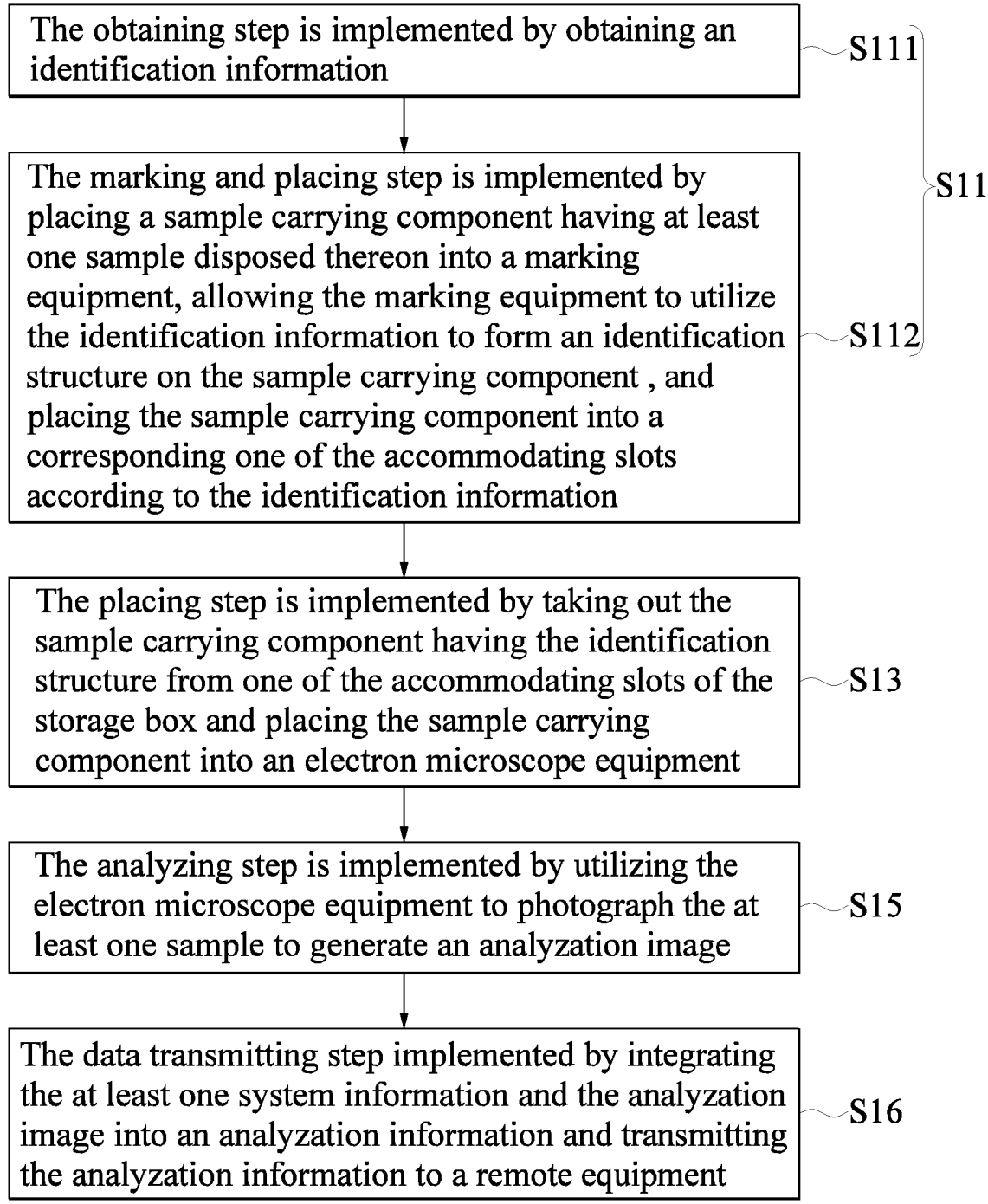
FIG. 9 is a flowchart of a sample analyzing method according to one embodiment of the present disclosure.

Referring to FIG. 9, the difference between the sample analyzing method of the present embodiment and the sample analyzing method of the previous embodiment is as follows. In the obtaining step S111, a system information is further obtained in addition to the identification information. The system information can include at least one system numeral and a customer data. After the analyzing step S15, the sample analyzing method can further include a data transmitting step S16 implemented by integrating the at least one system information and the analysis image into an analyzation information and transmitting the analyzation information to a remote equipment. The analysis image in the analyzation information including corresponding customer data is configured to be read by a customer connecting to the remote equipment. The remote equipment can be various types of cloud devices (e.g., a server), and the present disclosure is not limited thereto.

For example, when a customer entrusts a sample to a sample analyzing vendor for analyzation, the sample analyzing vendor generates related information (i.e., the system information) of the customer and the sample through equipment, such as a computer. After the sample analyzing vendor utilizes the electron microscope equipment to observe and analyze the sample, the analysis image photographed by the electron microscope equipment and related information (i.e., the analyzation information) of the customer and the sample are uploaded to the cloud. After the customer connects to the cloud and logs in an account, the customer can view or download the analysis image. Naturally, in other embodiments, the analyzation information can also include an analyzation result information generated by technical personnel or a related computer after analyzing the analysis image, and after the customer connects to the cloud and logs in the account, the customer can view or download the analyzation result information.

The system numeral can be a string decided by the sample analyzing vendor, and the sample analyzing vendor can identify data such as a sequence, a customer name, and a type of the sample that is currently analyzed through the system numeral. Or, the system numeral can be a serial number defined by the sample analyzing vendor, but the present disclosure is not limited thereto.

Figure 10:
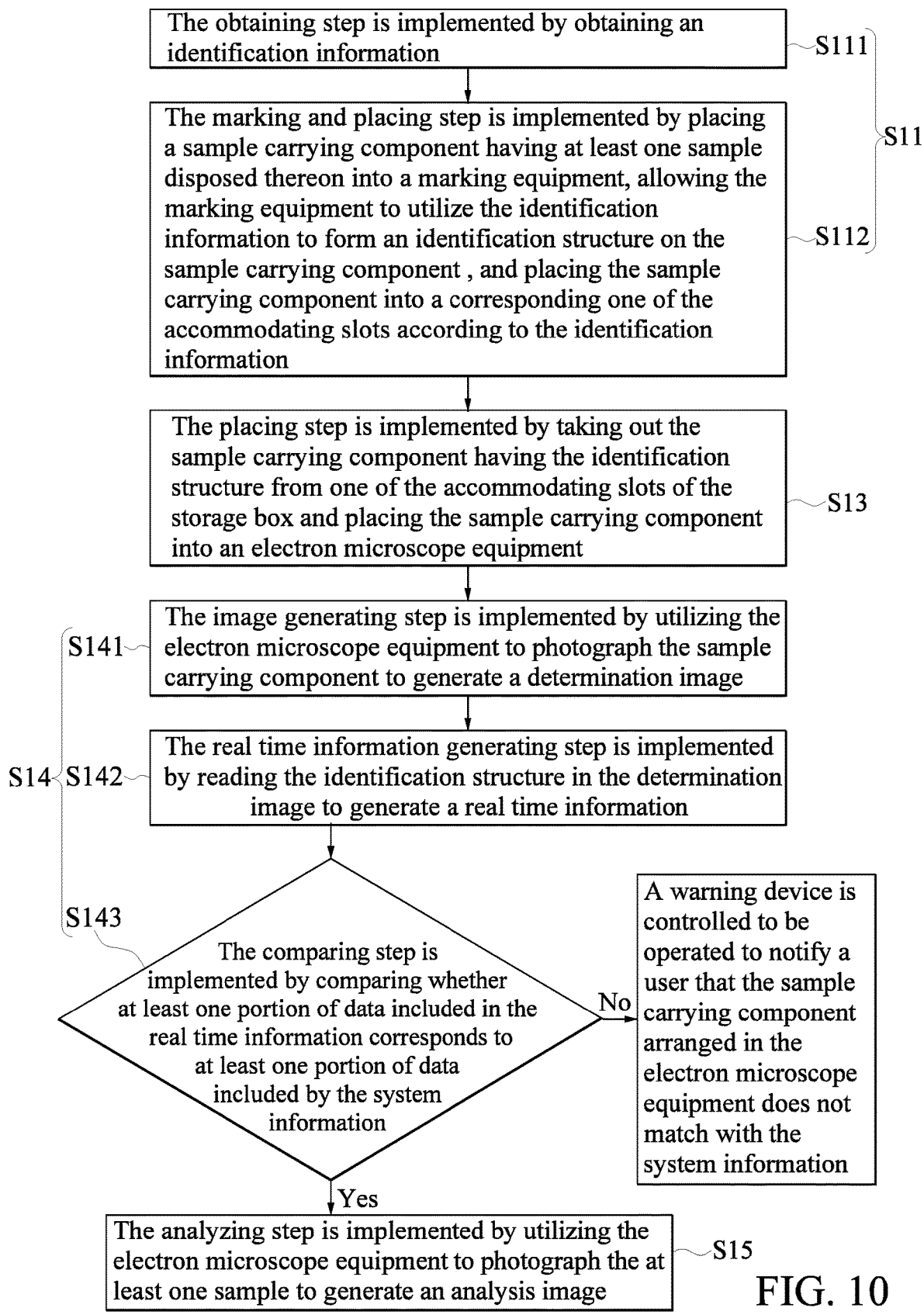
FIG. 10 is a flowchart of a sample analyzing method according to one embodiment of the present disclosure.

Referring to FIG. 10, the difference between the sample analyzing method of the present embodiment and the sample analyzing method of the previous embodiment is as follows. Between the placing step S13 and the analyzing step S15, the sample analyzing method further includes a determining step S14. The determining step S14 includes an image generating step S141, a real time information generating step S142, and a comparing step S143.

The image generating step S141 is implemented by utilizing the electron microscope equipment to photograph the sample carrying component 1 to generate a determination image. The real time information generating step S142 is implemented by reading the identification structure 13 in the determination image to generate a real time information. The comparing step S143 is implemented by comparing whether at least one portion of data included in the real time information corresponds to at least one portion of data included by the system information.

In response to the at least one portion of data included in the real time information corresponding to the at least one portion of the data included by the system information, the analyzing step S15 is implemented.

In response to the at least one portion of data included in the real time information not corresponding to the at least one portion of data included in the system information, a warning device is controlled to be operated to notify a user that the sample carrying component currently arranged in the electron microscope equipment does not match the system information.

It should be noted that in a practical application, the real time information generating step S142 can be implemented through a computer connected to the electron microscope equipment, or can be implemented through a related processor in the electron microscope equipment. The computer or the related processor can perform an image identifying operation on the determination image, so as to identify the content presented by the identification structure 13 on the sample carrying component 1 and accordingly generate the real time information.

For example, if the sample carrying component 1 already undergoing the marking and placing step S112 is presented in FIG. 6, the determination image generated in the image generating step S141 is equal to the image shown in FIG. 6. In the real time information generating step S142, the related computer or processor performs the image identifying operation on the determination image shown in FIG. 6 to read the string "C3" corresponding to the identification structure on the sample carrying component 1, and in the comparing step S143, the computer or processor determines whether the system information includes "C3" or a related information equal to the string "C3". If the computer or processor determines that the system information includes the related information including the string, the computer or processor determines that the sample carrying component currently arranged in the electron microscope equipment is the same as the sample carrying component that is currently preset to be analyzed by the system, and the analyzing step S15 is then implemented.

According to the above, in contrast, if the computer or processor determines that the system information does not include "C3" or a related information equal to the string "C3", the analyzing step S15 is not implemented, and a warning device (e.g., various devices that can make a sound, transmit information, or emit light to notify technical personnel) is controlled to be operated to notify the user that the sample carrying component 1 currently arranged in the electron microscope equipment is not the same as the sample carrying component 1 that is currently preset to be analyzed by the system. In this way, a recording mistake that occurs when technical personnel places a wrong sample carrying component 1 into the electron microscope equipment and still implements the analyzing step S15 can be effectively prevented.

Figure 11B:
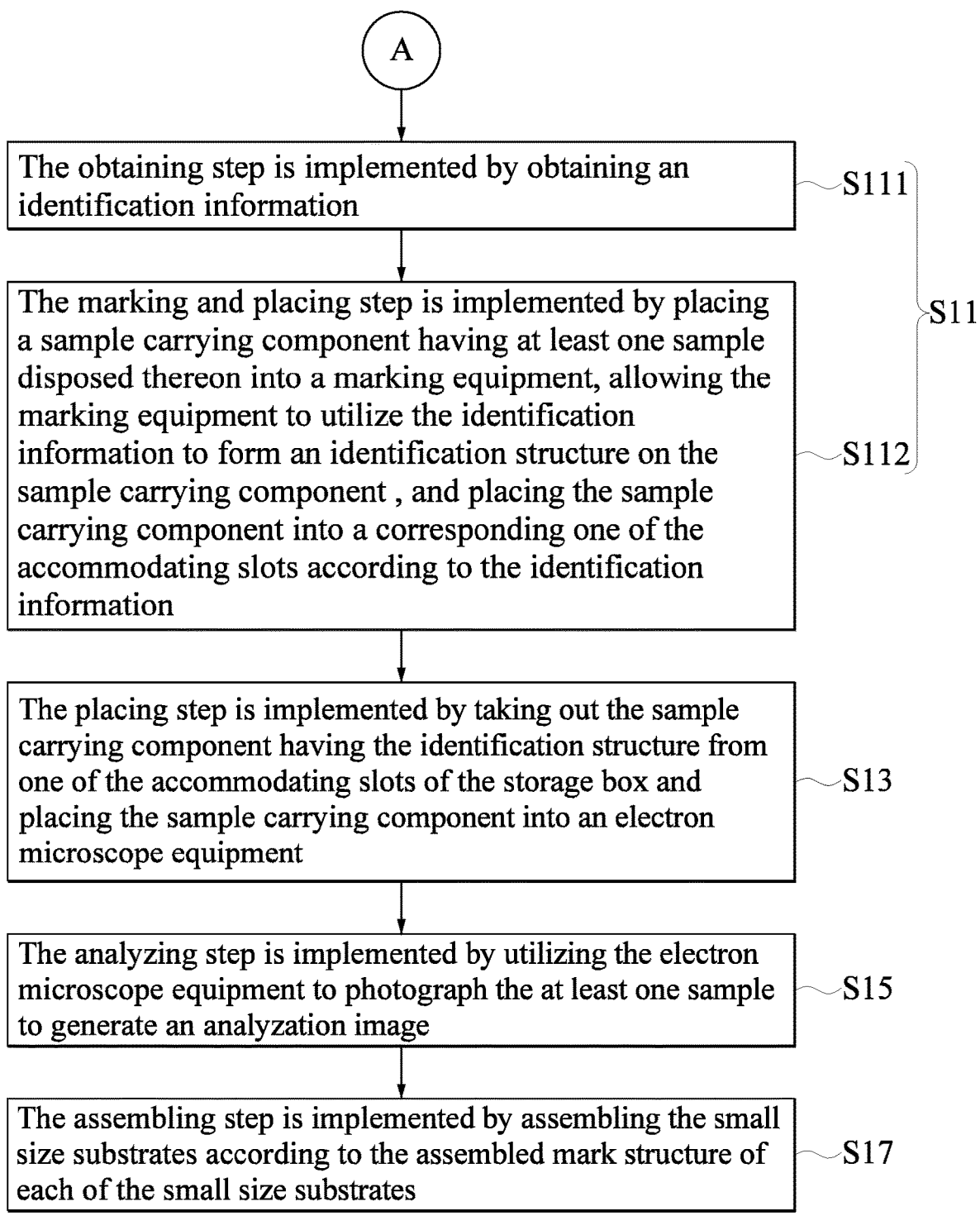

Referring to FIG. 11A and FIG. 11B, the difference between the sample analyzing method of the present embodiment and the sample analyzing method of the previous embodiment is as follows. Before the obtaining step S111, the sample analyzing method further includes a preparation step S02 that is implemented by placing the sample S onto the mesh structure 12 of the sample carrying component 1 and placing the sample carrying component 1 having the sample S disposed thereon into one of the accommodating slots 211 of the storage box 2, and utilizing an input device to input a content presented by a mark structure 23 of the storage box 2 near the one of the accommodating slots 211 to the input device to form the identification information.

For example, the electron microscope equipment can be connected to a computer, the computer can be connected to a mouse, a keyboard (i.e., the input device), and a screen. In the preparation step S02, after technical personnel places the sample S onto the sample carrying component 1, technical personnel can place the sample carrying component 1 having the sample S disposed thereon into one of the accommodating slots 211 (as shown in FIG. 6) of the storage box 2 presented as "C3", and technical personnel can then input "C3" into the computer through the mouse and the keyboard, so that the computer accordingly generates the identification information including the string "C3" or a related data equal to the string. Naturally, the input device mentioned herein can be any device (e.g., a touch screen or physical buttons) configured to input the string. In addition, the computer mentioned herein can be a device independent to the electron microscope equipment, or a related processing device disposed inside of the electron microscope equipment.

Figure 12:
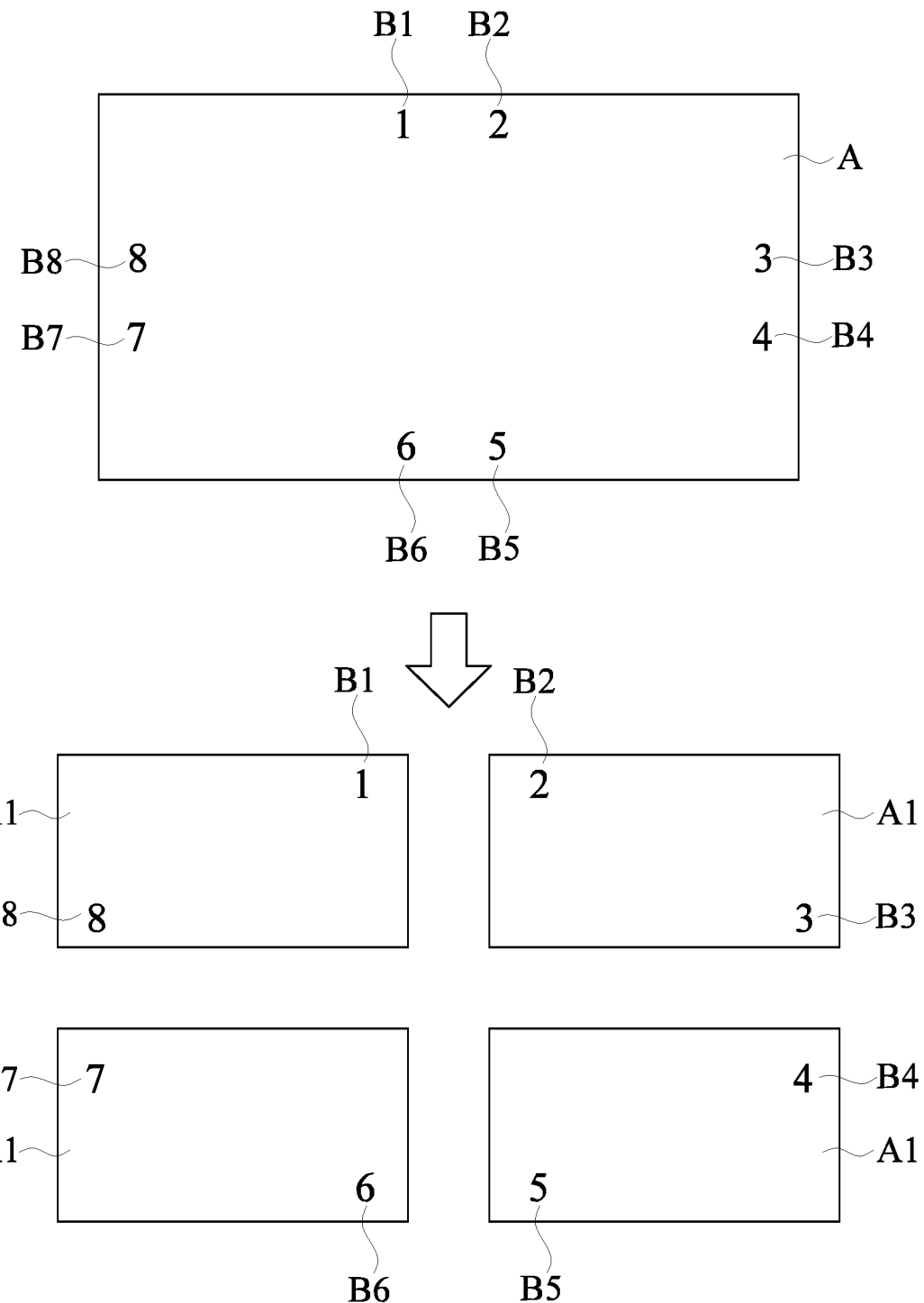
FIG. 12 is a schematic view of a large size substrate and a plurality of small size substrates of the sample analyzing method according to one embodiment of the present disclosure.

Referring to FIG. 11A, FIG. 11B and FIG. 12, the difference between the sample analyzing method of the present embodiment and the sample analyzing method of the previous embodiment is as follows. Before the preparation step S02, the sample analyzing method further includes a marking and cutting step S01. The marking and cutting step S01 includes an assembled marking and placing step S011, a large size cutting step S012, and a sampling step S013.

The assembled marking and placing step S011 is implemented by utilizing the marking equipment to form eight assembled mark structures B1 to B8 having different styles on a large size substrate A. The large size cutting step S012 is implemented by utilizing a cutting equipment to perform a cutting operation on the large size substrate A at least once, so that the large size substrate A is cut into a plurality of small size substrates A1. Each of the small size substrates A1 includes one of the assembled mark structures. The sampling step S013 is implemented by utilizing a sampling equipment to cut one of the small size substrates A1 to obtain the sample S.

After the analyzing step S15, the sample analyzing method further includes an assembling step S17 that is implemented by assembling the small size substrates A1 according to the assembled mark structures B of each of the small size substrates A1.

In a practical application, the marking equipment mentioned in the assembled marking and placing step S011 can be the same as the marking equipment mentioned in the marking and placing step S112, but the preset disclosure is not limited thereto. The cutting equipment and the sampling equipment mentioned in the large size cutting step S012 and the sampling step S013 can be decided according to the type and the material of the large size substrate A, but the present disclosure is not limited thereto.

Specifically, the sample analyzing vendor may receive the large size substrate A provided by the customer, and the customer requires the sample analyzing vendor to sample and analyze a failure position of the large size substrate A. At this time, the sample analyzing method of the present embodiment can be implemented to cut the large size substrate A, and one portion of one of the small size substrates B at the failure position can be taken out to be made into a sample. After the sample analyzing vendor finishes analyzing, the sample analyzing vendor can assemble the small size substrates A1 according to the assembled mark structures B on each of the small size substrates A1, and return the assembled small size substrates A1 to the customer.

According to the above, in the sample analyzing method of the present embodiment, after the sample analyzing vendor finishes analyzing the sample, the small size substrates A1 can be quickly and correctly assembled, and the assembled small size substrates A1 can have a structure substantially to a structure of the original large size substrate A originally provided by the customer.

Referring to FIG. 13, a sample preparing method of the present disclosure includes an obtaining step S21 and a marking and placing step S22.

The obtaining step S21 is implemented by obtaining an identification information. The identification information is configured to show a position of one of the accommodating slots of a storage box, and the storage box includes the accommodating slots.

The marking and placing step S22 is implemented by placing a sample carrying component having at least one sample disposed thereon into a marking equipment, allowing the marking equipment to utilize the identification information to form an identification structure on the sample carrying component, and placing the sample carrying component into a corresponding one of the accommodating slots according to the identification information. The sample carrying component includes a main body and at least one mesh structure, the main body has at least one thru-hole penetrating through the main body, the at least one mesh structure is connected to the main body, the at least one mesh structure is arranged in the at least one thru-hole, the at least one mesh structure divides the at least one thru-hole into a plurality of meshes, and the at least one mesh structure is configured to carry the at least one sample The obtaining step S21 and the marking and placing step S22 of the present embodiment are the same as the above-mentioned obtaining step S111 and the marking and placing step S112 of the previous embodiment, and will not be reiterated herein.

Beneficial Effects of the Embodiments

In conclusion, through the sample analyzing method and the sample preparing method of the present disclosure, after technical personnel finishes observing the sample through the electron microscope equipment, a probability of the sample carrying component and the sample carried thereby being placed in a wrong position of the storage box by technical personnel can be effectively decreased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A sample analyzing method, comprising:
a sample preparing step implemented at least once, wherein the sample preparing step includes:
a marking and cutting step including:
utilizing a marking equipment to form a plurality of assembled mark structures having different styles on a large size substrate;
utilizing a cutting equipment to perform a cutting operation on the large size substrate at least once, so that the large size substrate is cut into a plurality of small size substrates, wherein each of the small size substrates includes one of the assembled mark structures; and
utilizing a sampling equipment to cut one of the small size substrates to obtain at least one sample
a preparation step implemented by placing the at least one sample onto at least one mesh structure of the sample carrying component, and placing the sample carrying component having the at least one sample disposed thereon into one of a plurality of accommodating slots of a storage box, and wherein, in the marking and placing step, the sample carrying component having the at least one sample disposed thereon is taken out from the one of the accommodating slots of the storage box, and utilizing an input device to input a content presented by a mark structure of the storage box near the one of the accommodating slots to the input device to form the identification information;
an obtaining step implemented by obtaining an identification information, wherein the identification information is configured to indicate a position of one of the accommodating slots of the storage box, and the storage box includes the accommodating slots; and
a marking and placing step implemented by placing a sample carrying component having the at least one sample disposed thereon into the marking equipment, allowing the marking equipment to utilize the identification information to form an identification structure on the sample carrying component, and placing the sample carrying component into a corresponding one of the accommodating slots according to the identification information, wherein the sample carrying component includes a main body and the at least one mesh structure, the main body has at least one thru-hole penetrating through the main body, the at least one mesh structure is connected to the main body, the at least one mesh structure is arranged in the at least one thru-hole, the at least one mesh structure divides the at least one thru-hole into a plurality of meshes, and the at least one mesh structure is configured to carry the at least one sample;
a placing step implemented by taking out the sample carrying component having the identification structure from one of the accommodating slots of the storage box, and placing the sample carrying component into an electron microscope equipment; and
an analyzing step implemented by utilizing the electron microscope equipment to photograph the at least one sample to generate an analysis image.
2. The sample analyzing method according to claim 1, wherein, in the obtaining step, a system information is further obtained in addition to the identification information, and the system information includes at least one system numeral and customer data, wherein, after the analyzing step, the sample analyzing method further includes a data transmitting step implemented by integrating the at least one system information and the analyzation image into an analyzation information, and transmitting the analyzation information to a remote equipment, and wherein the analyzation image in the analyzation information including the corresponding customer data is configured to be read by a customer connecting to the remote equipment.

3. The sample analyzing method according to claim 2, wherein, between the placing step and the analyzing step, the sample analyzing method further includes a determining step including:
   utilizing the electron microscope equipment to photograph the sample carrying component to generate a determination image;
   reading the identification structure in the determination image to generate a real time information; and
   comparing whether at least one portion of data included in the real time information corresponds to at least one portion of data included by the system information;
   in response to the at least one portion of data included in the real time information corresponding to the at least one portion of data included in the system information, the analyzing step is implemented; and
   in response to the at least one portion of data included in the real time information not corresponding to the at least one portion of data included in the system information, a warning device is controlled to be operated to notify a user that the sample carrying component currently arranged in the electron microscope equipment does not match the system information.

4. The sample analyzing method according to claim 1, wherein the identification structure is recessed in one side of the main body, or the identification structure is a thru-hole structure penetrating through the main body, and wherein the identification structure is presented in at least one of a textual manner, a numerical manner, a symbolic manner, and a patterned manner.

5. The sample analyzing method according to claim 1, wherein, in the marking and placing step, the marking equipment is utilized to form two identification structures on the sample carrying component, each of the identification structures is presented in at least one of a textual manner, a numerical manner, a symbolic manner, and a patterned manner, one of the identification structures is configured to enable a user to identify a longitudinal position of the sample carrying component disposed in the storage box, and another one of the identification structures is configured to enable the user to identify a horizontal position of the sample carrying component disposed in the storage box.

6. The sample analyzing method according to claim 1, wherein, in the marking and placing step, the marking equipment is further utilized to form at least one of at least one position identification structure, a direction identification structure, and at least one sample identification structure, the sample carrying structure is connected to at least one of the main body and the at least one mesh structure, and the at least one position identification structure is configured to enable a user to identify a position of the at least one sample carried by the sample carrying component relative to a central position of the sample carrying component, wherein the at least one position identification structure is presented in at least one of a textual manner, a numerical manner, a symbolic manner, and a patterned manner, wherein the direction identification structure is connected to at least one of the main body and the at least one mesh structure, wherein the direction identification structure is disposed at one side of the main body, or the direction identification structure is disposed at a central position of the at least one mesh structure, wherein the direction identification structure is presented in at least one of a textual manner, a numerical manner, a symbolic manner, and a patterned manner, wherein the at least one sample identification structure is connected to at least one of the main body and the at least one mesh structure, and wherein the at least one sample identification structure is presented in at least one of a textual manner, a numerical manner, a symbolic manner, and a patterned manner.

7. A sample preparing method, comprising:
   a marking and cutting step including:
      utilizing a marking equipment to form a plurality of assembled mark structures on a large size substrate;
      utilizing a cutting equipment to perform a cutting operation on the large size substrate at least once, so that the large size substrate is cut into a plurality of small size substrates, wherein each of the small size substrates includes one of the assembled mark structures; and
      utilizing a sampling equipment to cut one of the small size substrates to obtain at least one sample;
   a preparation step implemented by placing the at least one sample onto at least one mesh structure of the sample carrying component and placing the sample carrying component having the at least one sample disposed thereon into one of a plurality of accommodating slots of a storage box, and wherein, in the marking and placing step, the sample carrying component having the at least one sample disposed thereon is taken out from the one of the accommodating slots of the storage box, and utilizing an input device to input a content presented by a mark structure of the storage box near the one of the accommodating slots to the input device to form the identification information;
   an obtaining step implemented by obtaining an identification information, wherein the identification information is configured to indicate a position of one of the accommodating slots of the storage box, and the storage box includes the accommodating slots;
   a marking and placing step implemented by placing a sample carrying component having the at least one sample disposed thereon into the marking equipment, allowing the marking equipment to utilize the identification information to form an identification structure on the sample carrying component, and placing the sample carrying component into a corresponding one of the accommodating slots according to the identification information, wherein the sample carrying component includes a main body and the at least one mesh structure, the main body has at least one thru-hole penetrating through the main body, the at least one mesh structure is connected to the main body, the at least one mesh structure is arranged in the at least one thru-hole, the at least one mesh structure divides the at least one thru-hole into a plurality of meshes, and the at least one mesh structure is configured to carry the at least one sample; and
   an assembling step implemented by assembling the small size substrates into the large size substrate according to the assembled mark structures of each of the small size substrates.

8. The sample preparing method according to claim 7, wherein the identification structure is recessed in one side of the main body, or the identification structure is a thru-hole structure penetrating through the main body, and wherein the identification structure is presented in at least one of a textual manner, a numerical manner, a symbolic manner, and a patterned manner.

9. The sample preparing method according to claim 7, wherein, in the marking and placing step, the marking equipment is utilized to form two identification structures on the sample carrying component, each of the identification structures is presented in at least one of a textual manner, a numerical manner, a symbolic manner, and a patterned manner, one of the identification structures is configured to enable a user to identify a longitudinal position of the sample carrying component disposed in the storage box, and another one of the identification structures is configured to enable a user to identify a horizontal position of the sample carrying component disposed in the storage box.

10. The sample preparing method according to claim 7, wherein, in the marking and placing step, the marking equipment is further utilized to form at least one of at least one position identification structure, a direction identification structure, and at least one sample identification structure, the sample carrying structure is connected to at least one of the main body and the at least one mesh structure, and the at least one position identification structure is configured to enable a user to identify a position of the at least one sample carried by the sample carrying component relative to a central position of the sample carrying component, wherein the at least one position identification structure is presented in at least one of a textual manner, a numerical manner, a symbolic manner, and a patterned manner, wherein the direction identification structure is connected to at least one of the main body and the at least one mesh structure, wherein the direction identification structure is disposed at one side of the main body, or the direction identification structure is disposed at a central position of the at least one mesh structure, wherein the direction identification structure is presented in at least one of a textual manner, a numerical manner, a symbolic manner, and a patterned manner, wherein the at least one sample identification structure is connected to at least one of the main body and the at least one mesh structure, and wherein the at least one sample identification structure is presented in at least one of a textual manner, a numerical manner, a symbolic manner, and a patterned manner.

* * * * *